(12) United States Patent
Seki et al.

(10) Patent No.: US 12,727,296 B2
(45) Date of Patent: Sep. 1, 2026

(54) CIRCUIT SUBSTRATE AND MOUNTED SUBSTRATE

(71) Applicant: TDK CORPORATION, Tokyo (JP)

(72) Inventors: Akiko Seki, Tokyo (JP); Takashi Watanabe, Tokyo (JP); Yukari Wada, Tokyo (JP); Susumu Taniguchi, Tokyo (JP); Hiroyuki Uematsu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 655 days.

(21) Appl. No.: 17/991,261

(22) Filed: Nov. 21, 2022

(65) Prior Publication Data

US 2023/0163249 A1 May 25, 2023

(30) Foreign Application Priority Data

Nov. 25, 2021 (JP) ................................ 2021-191371

(51) Int. Cl.
*H10H 20/85* (2025.01)
*H10H 20/856* (2025.01)
*H10H 20/857* (2025.01)

(52) U.S. Cl.
CPC ...... *H10H 20/8506* (2025.01); *H10H 20/856* (2025.01); *H10H 20/857* (2025.01)

(58) Field of Classification Search
CPC . H10H 20/856; H10H 20/857; H10H 20/8506
See application file for complete search history.

(56) References Cited

U.S. PATENT DOCUMENTS

2013/0026507 A1* 1/2013 Chung .................... F21V 31/04 257/E33.068
2013/0270594 A1* 10/2013 Cai ........................ H10H 20/85 257/98

FOREIGN PATENT DOCUMENTS

JP 2004-047772 A 2/2004
JP 2005038955 A * 2/2005
JP 2006093523 A * 4/2006
JP 2014-089996 A 5/2014

* cited by examiner

*Primary Examiner* — Jeff W Natalini
*Assistant Examiner* — Rose Keagy
(74) *Attorney, Agent, or Firm* — Oliff PLC

(57) ABSTRACT

A circuit substrate is a circuit substrate having at least one pair of terminals, wherein a bonding material containing a metal element is disposed above the terminals, the pair of terminals and the bonding material are disposed inside a wall formed by an insulator, and the wall has an uneven portion on an inner side surface.

7 Claims, 12 Drawing Sheets

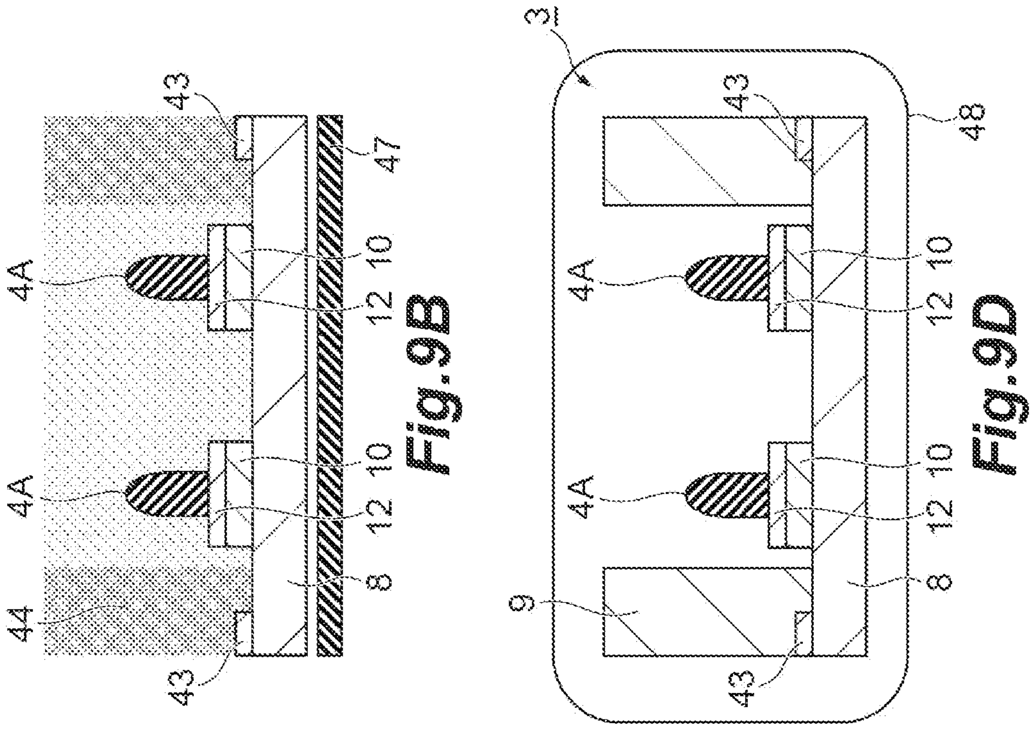
*Fig.9B*
*Fig.9D*
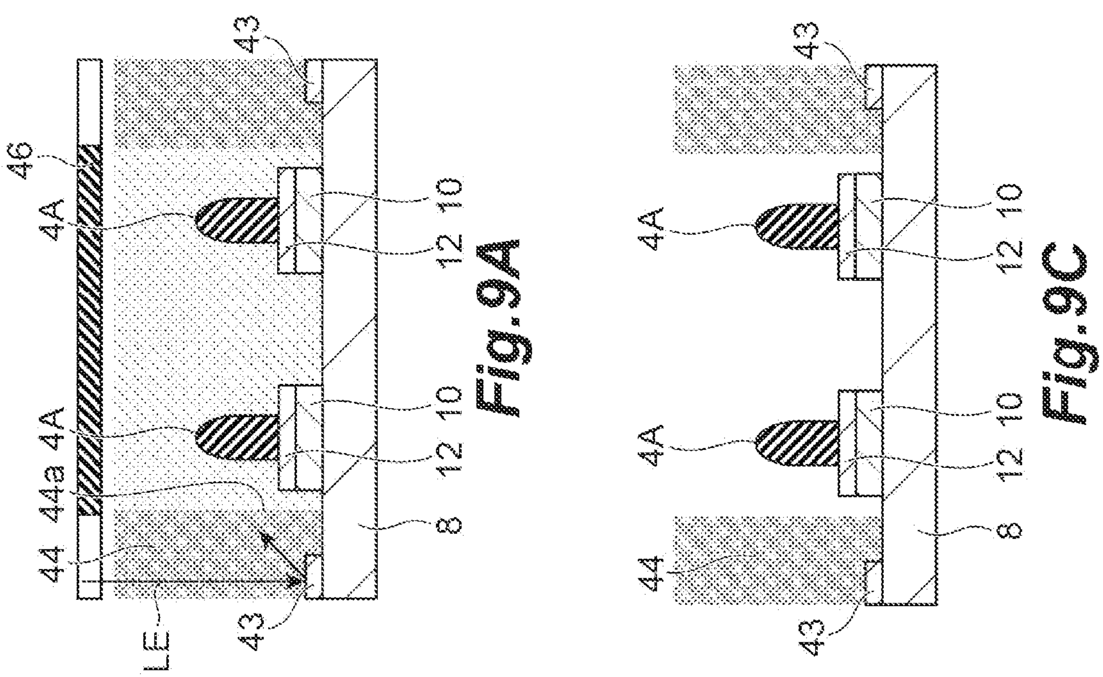
*Fig.9A*
*Fig.9C*

2
3
4A
4B
8
9
10
11
12
20
49

CIRCUIT SUBSTRATE AND MOUNTED SUBSTRATE

CROSS REFERENCE TO RELATED APPLICATIONS

This application claims priority to Japanese Patent Application No. 2021-191371 filed on Nov. 25, 2021, the entire contents of which are incorporated by reference herein.

TECHNICAL FIELD

The present disclosure relates to a circuit substrate and a mounted substrate.

BACKGROUND

In recent years, digitalization has progressed, and along with this, the development of technology for mounting electronic components on substrates is progressing. For example, a technology for mounting a large number of bare chips of semiconductor light emitting elements, such as light emitting diodes (hereinafter, referred to as "LEDs") used for lighting and display devices, on a wiring substrate has been developed. For example, Japanese Unexamined Patent Publication No. 2006-93523 discloses a configuration in which a semiconductor light emitting element is inserted and bonded into a cavity in which a plurality of semiconductor light emitting elements can be easily positioned and arranged. In addition, Japanese Unexamined Patent Publication No. 2004-47772 has also developed a technique for curbing bringing-back of a semiconductor light-emitting element and solder bridging in electronic component mounting using a paste-like bonding material.

SUMMARY

Here, when an electronic component is to be mounted in a cavity as described in Patent Document 1 using a paste-like electronic component bonding material as described in Patent Document 2, after the electronic component is moved and mounted by a holding member, there is a possibility that the electronic component may be brought back by the holding member. Therefore, there is a demand for a circuit substrate that can curb defects caused by bringing-back when a mounted substrate is constructed, and can improve the yield.

An object of the present disclosure is to provide a circuit substrate and a mounted substrate that can improve yield.

A circuit substrate according to the present disclosure is a circuit substrate having at least one pair of terminals, wherein a bonding material containing a metal element is disposed above the terminals, the pair of terminals and the bonding material are disposed inside a wall formed by an insulator, and the wall has an uneven portion on an inner side surface.

In the circuit substrate according to the present disclosure, the wall has the uneven portion on the inner side surface. In this case, a surface area of the inner side surface of the wall is increased. With such a configuration, when a constituent material such as an adhesive is disposed inside the wall, the constituent material is held on the inner side surface having a large surface area and easily stays inside the wall. Therefore, when an electronic component is inserted inside the wall, the electronic component is held by the constituent material that easily stays inside the wall, and thus it is possible to curb bringing-back of the electronic component. As described above, it is possible to improve the yield when the mounted substrate is constructed.

The uneven portion may extend in a thickness direction of the circuit substrate. In this case, when the constituent material is disposed inside the wall, entrainment of air between the inner side surface of the wall and the constituent material can be curbed. Therefore, it is possible to curb a decrease in a contact area between the inner side surface and the constituent material due to the entrained air. As a result, it is possible to curb a decrease in a holding force of the electronic component by the constituent material.

In plan view, when a reference line is set in a direction in which the inner side surface expands, and a length of the reference line is set to a length a, and a length of the wall corresponding to the reference line is set to a length L, (length L/length a) may be 1.02 or more and 1.20 or less. When (Length L/Length a) is 1.02 or more, the surface area of the inner side surface of the wall is sufficiently increased, and the constituent material can easily stay inside the wall. In addition, when (length L/length a) is 1.20 or less, it being difficult for the constituent material to enter a valley portion of the uneven portion can be curbed.

In plan view, when the reference line is set in the direction in which the inner side surface expands, the wall may have 40 or more and 1200 or less uneven portions per 1 mm of the reference line. In this case, when the wall has 40 or more uneven portions per 1 mm of the reference line, the surface area of the inner side surface of the wall is sufficiently increased, and the constituent material can easily stay inside the wall. In addition, when the wall has 1200 or less uneven portions per 1 mm of the reference line, it being difficult for the constituent material to enter a valley portion of the uneven portion can be curbed.

A reflector may be formed on an upper surface of a base material on which the wall is provided inside the wall. In this case, light can be reflected by the reflector when the wall is photo-cured. The reflected light can form a pattern of the uneven portion at a portion corresponding to the inner side surface of the wall.

A mounted substrate according to the present disclosure has an electronic component mounted on the terminals of the circuit substrate described above. According to such a mounted substrate, the yield can be improved by mounting the electronic component on the circuit substrate described above.

According to the present disclosure, it is possible to provide a circuit substrate and a mounted substrate that can improve yield.

BRIEF DESCRIPTION OF THE DRAWINGS

FIGS. 9A, 9B, 9C, and 9D are schematic cross-sectional views showing the method of manufacturing a circuit substrate and a mounted substrate.

DETAILED DESCRIPTION

Figure 1:
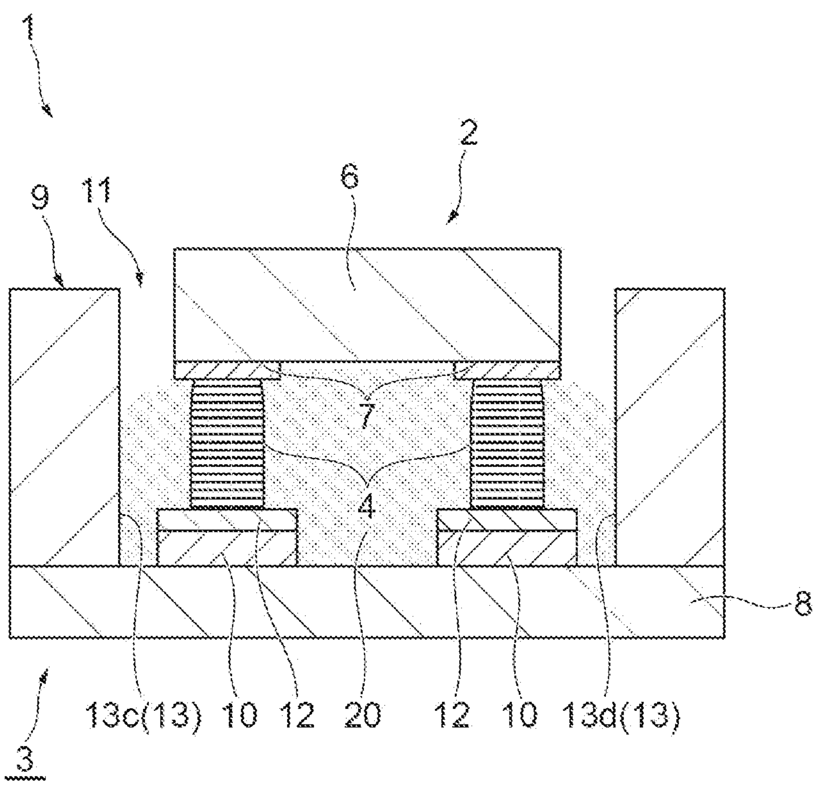
FIG. 1 is a schematic cross-sectional view showing a mounted substrate including a circuit substrate according to an embodiment of the present disclosure.
Figure 2:
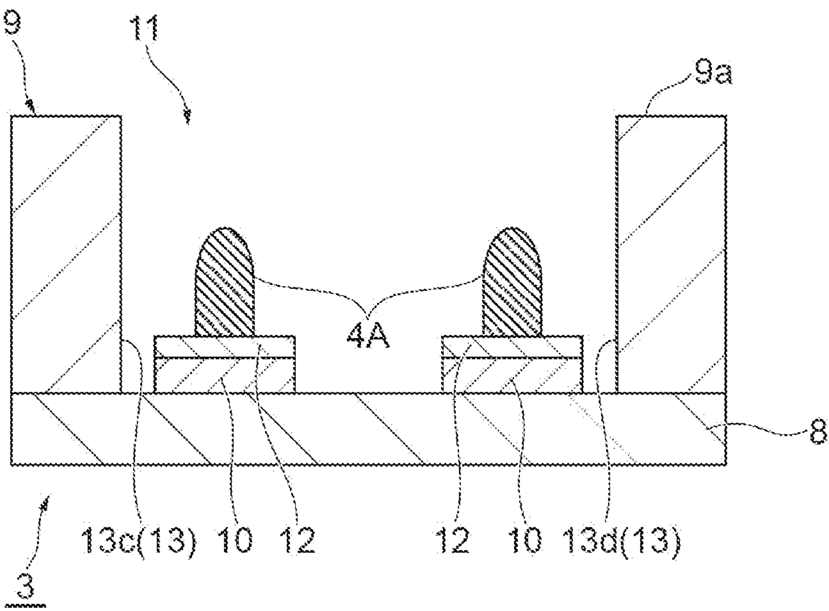
FIG. 2 is a schematic cross-sectional view showing the circuit substrate according to the embodiment of the present disclosure.
Figure 3:
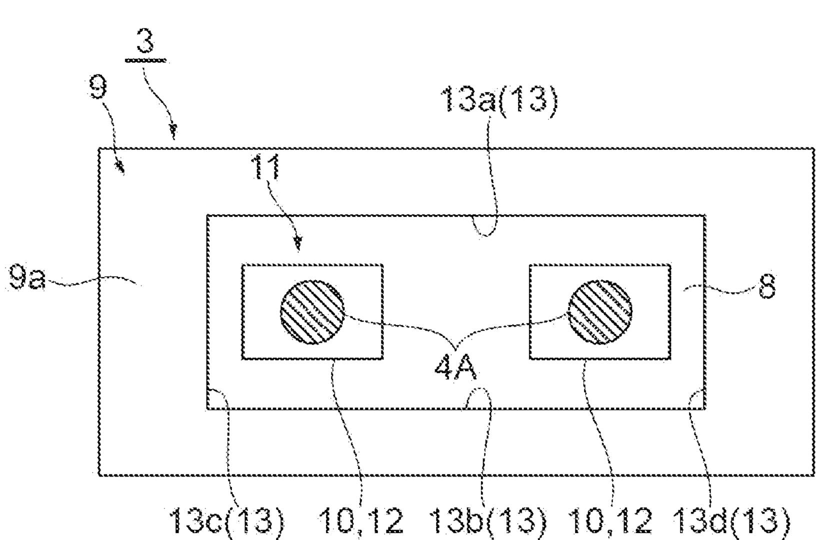
FIG. 3 is a plan view of the circuit substrate 3.

A circuit substrate 3 according to an embodiment of the present disclosure will be described with reference to FIGS. 1 to 3. FIG. 1 is a schematic cross-sectional view showing a mounted substrate 1 including the circuit substrate 3 according to the embodiment of the present disclosure. FIG. 2 is a schematic cross-sectional view showing the circuit substrate 3 according to the embodiment of the present disclosure. FIG. 3 is a plan view of the circuit substrate 3.

As shown in FIG. 1, the mounted substrate 1 includes an electronic component 2 and the circuit substrate 3. The mounted substrate 1 is configured by mounting the electronic component 2 on the circuit substrate 3 via a bonding material 4.

The electronic component 2 includes a body portion 6 and a pair of terminals 7. The body portion 6 is a member for exhibiting a function as the electronic component 2. The terminals 7 are metal portions formed on a main surface of the body portion 6. Metals such as Cu, Ti, Au, Ni, Sn, Bi, P, B, In, Ag, Zn, Pd, Mo, Pt, and Cr, and alloys selected from at least two of them are used as a material for the terminals 7. The electronic component 2 is configured of, for example, a micro LED, or the like. The micro LED is a component that emits light according to an input from the circuit substrate 3.

The circuit substrate 3 includes a base material 8, a wall 9 and a pair of terminals 10. The base material 8 is a flat plate-shaped body portion of the circuit substrate 3. The wall 9 is a member formed of an insulator formed on an upper surface of the base material 8. A resin material such as an epoxy resin, an acrylic resin, a phenol resin, a melamine resin, a urea resin, and an alkyd resin is used as a material of the wall 9. Particularly, preferably, the material of the wall 9 is epoxy resin or acrylic resin. The terminals 10 are metal portions formed on the main surface of the base material 8. Ni, Cu, Ti, Cr, Al, Mo, Pt, Au, an alloy selected from at least two of them, or the like is used as a material for the terminals 10. A conductive film 12 is formed on an upper surface of the terminal 10. A film of Ti, Cu, Ni, Al, Mo, Cr, Ag, or the like, a film in which metal particles and a binder are mixed, or the like is used as a material for the conductive film 12.

The bonding material 4 is a member that bonds the terminals 7 of the electronic component 2 and the terminals 10 of the circuit substrate 3. The bonding material 4 is configured by thermally bonding and integrating a bonding material 4A on the mounted substrate 1 side and a bonding material 4B on the electronic component 2 side (refer to FIG. 11C). The bonding material 4 may contain Sn or may be made of an alloy containing Sn. However, the bonding material 4 is not necessarily limited to one containing Sn. The bonding material 4 may be made of an alloy containing, in addition to Sn, an element that lowers a melting point of Sn. Examples of the element that lowers the melting point of Sn include Bi. The bonding material 4 functions as solder. Thus, the terminals 10, the conductive film 12, the bonding material 4, and the terminals 7 are stacked in this order from the upper surface of the base material 8 between the base material 8 and the body portion 6. Soldering is performed at that location after the terminal 10, the conductive film 12, the bonding material 4, and the terminal 7 are stacked. Therefore, a structure in which the metals of the terminal 10, the conductive film 12, the bonding material 4, and the terminal 7 are melted and diffused is formed. The structure after such solder bonding may be a structure containing a brittle intermetallic compound (IMC). When an intermetallic compound having a brittle structure is present, it is likely to be fractured due to stress from the outside, and thus reliability tends to decrease. Therefore, the effect of protecting the electronic component 2 is achieved by surrounding the electronic component 2 with the wall 9.

A recess 11 is formed in the wall 9. The recess 11 is configured by a through hole that passes through the wall 9. Thus, the upper surface of the base material 8 is exposed on the bottom side of the recess 11. The recess 11 has a rectangular shape when seen in a thickness direction of the circuit substrate 3 (refer to FIG. 3). The terminal 7, the terminal 10, the conductive film 12, and the bonding material 4 are disposed in the recess 11 formed in the wall 9 so as to be surrounded by the wall 9. A slight gap is formed between the terminal 7, the terminal 10, the conductive film 12, the bonding material 4, and four inner side surfaces of the recess 11 (that is, inner side surfaces of the wall 9).

A constituent material 20 is disposed between the electronic component 2 and the bonding material 4 and the wall 9 in the recess 11. Thus, the electronic component 2 can be made difficult to be separated from the circuit substrate 3 by being supported by the constituent material 20. Moreover, a force applied to the electronic component 2, the bonding material 4, the terminal 7, and the terminal 10 is reduced, and reliability can be improved. As a material for the constituent material 20, for example, an epoxy resin, an acrylic resin, a phenolic resin, a melamine resin, a urea resin, an alkyd resin, a mixture thereof, or a mixture of the above resin materials with $SiO_x$, ceramics, and the like are used. The epoxy resin and the acrylic resin are particularly preferably used as the material of the constituent material 20.

As shown in FIG. 2, the circuit substrate 3 has a configuration in which the electronic component 2 and the constituent material 20 are removed from the mounted substrate 1 shown in FIG. 1. In the circuit substrate 3, the bonding material 4A containing a metal element is disposed above the terminals 10 (on the upper surface of the conductive film 12). The bonding material 4A constitutes a part of the bonding material 4 in the previous stage in which the electronic component 2 and the mounting substrate 1 are thermally bonded as described above. In the state of the circuit substrate 3, the pair of terminals 10, the conductive film 12 and the bonding material 4A are disposed inside the wall 9 formed of an insulator.

As shown in FIG. 3, the recess 11 of the wall 9 has inner side surfaces 13*a* and 13*b* forming a pair of long sides and inner side surfaces 13*c* and 13*d* forming a pair of short sides. Thus, a region surrounded by the wall 9 is defined by the inner side surfaces 13*a*, 13*b*, 13*c* and 13*d* corresponding to each of the sides. As shown in FIG. 2, a slight gap is formed between one terminal 10, the conductive film 12, the bonding material 4A, and the inner side surface 13*c* of the wall 9. A slight gap is formed between the other terminal 10, the conductive film 12, the bonding material 4A, and the inner side surface 13*d* of the wall 9. In the following description, when the inner side surfaces 13*a*, 13*b*, 13*c*, and 13*d* are comprehensively described without distinguishing between them, they are referred to as an "inner side surface 13".

Figure 4B:
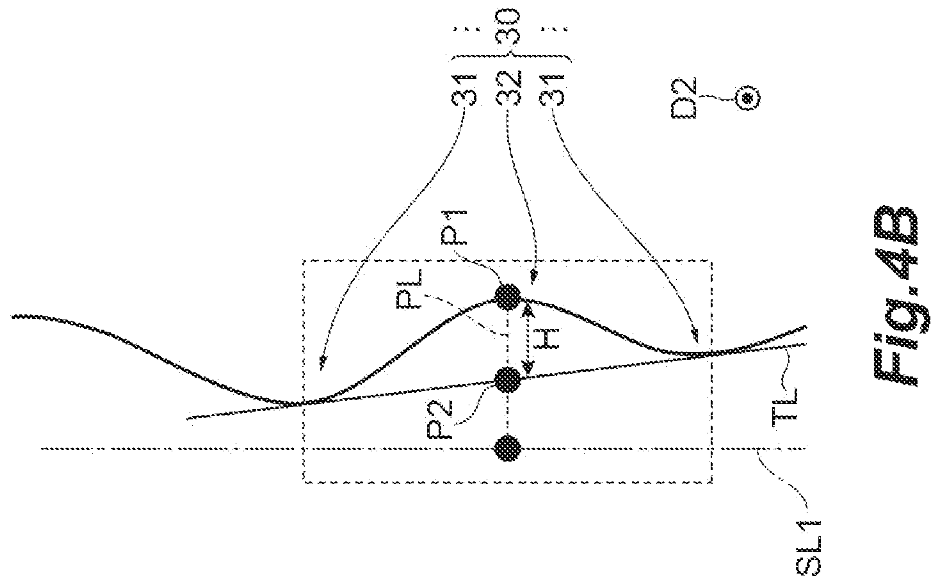
FIG. 4B is a conceptual diagram for describing the definition of one uneven portion.
Figure 4A:
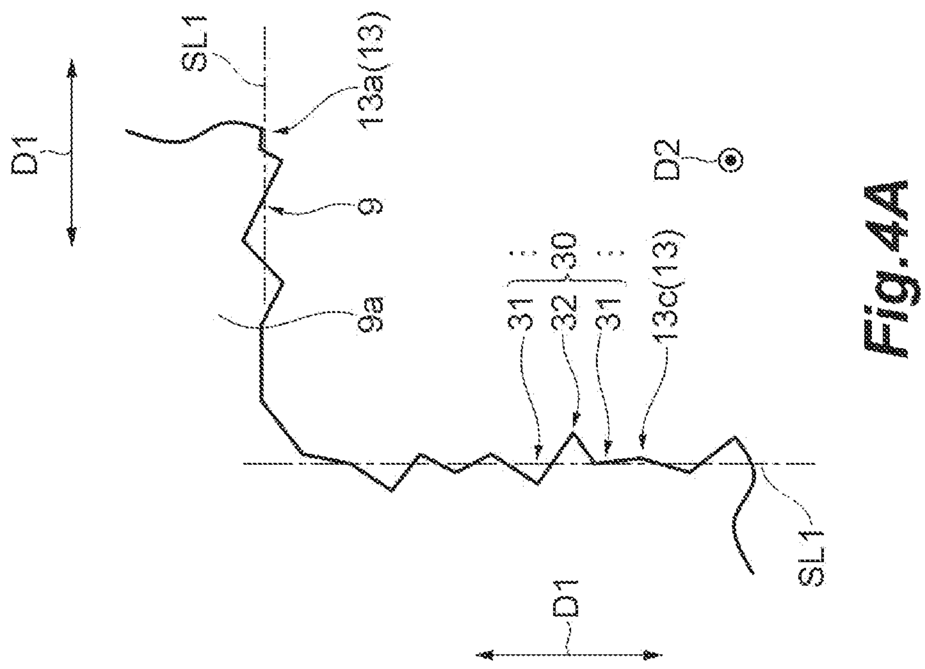
FIG. 4A is an enlarged plan view of inner side surfaces of a wall.

Next, a configuration of the inner side surface 13 of the wall 9 will be described with reference to FIGS. 4A and 4B. FIG. 4A is an enlarged plan view of the inner side surface 13 of the wall 9. FIG. 4B is a conceptual diagram for describing the definition of one uneven portion 30. In plan view, a direction in which the inner side surface 13 expands is defined as an "expansion direction D1". Further, a thickness direction of the circuit substrate 3 is defined as a "thickness direction D2." The expansion direction D1 differs according to the inner side surfaces 13*a*, 13*b*, 13*c*, and 13*d*. As shown in FIGS. 4A and 4B, the expansion direction D1 of the inner side surface 13*a* and the expansion direction D1 of the inner side surface 13*c* are orthogonal to each other. When simply referred to as "the expansion direction D1 of the inner side surface 13," it means the expansion direction D1 for each of the inner side surfaces without distinguishing between the inner side surfaces 13*a*, 13*b*, 13*c*, and 13*d*.

As shown in FIG. 4A, the wall 9 has an uneven portion 30 on the inner side surface 13. The uneven portion 30 is configured by alternately arranging valley portions 31 and peak portions 32. One peak portion 32 is formed between one valley portion 31 and the adjacent valley portion 31. Further, the inner side surface 13 has a plurality of uneven portions 30 in the expansion direction D1. FIG. 4A shows a state in which the uneven portions 30 are formed on the inner side surface 13*c* and the uneven portion 30 is formed on the inner side surface 13*a*. However, the uneven portions 30 are also formed on the inner side surfaces 13*b* and 13*d*.

In plan view, a reference line SL1 is set in the expansion direction D1 in which the inner side surface 13 expands. The reference line SL1 may be a statistical approximation straight line set for a curve drawn by the plurality of uneven portions 30. For example, a curve drawn by the inner side surface 13 having the uneven portion 30 in an image in plan view may be regarded as a graph, an average straight line may be calculated for the graph, and the average straight line may be set as the reference line SL1. A statistical calculation method for calculating such a reference line SL1 is not particularly limited, and a calculation method such as linear approximation by least-squares regression may be used.

Figure 6:
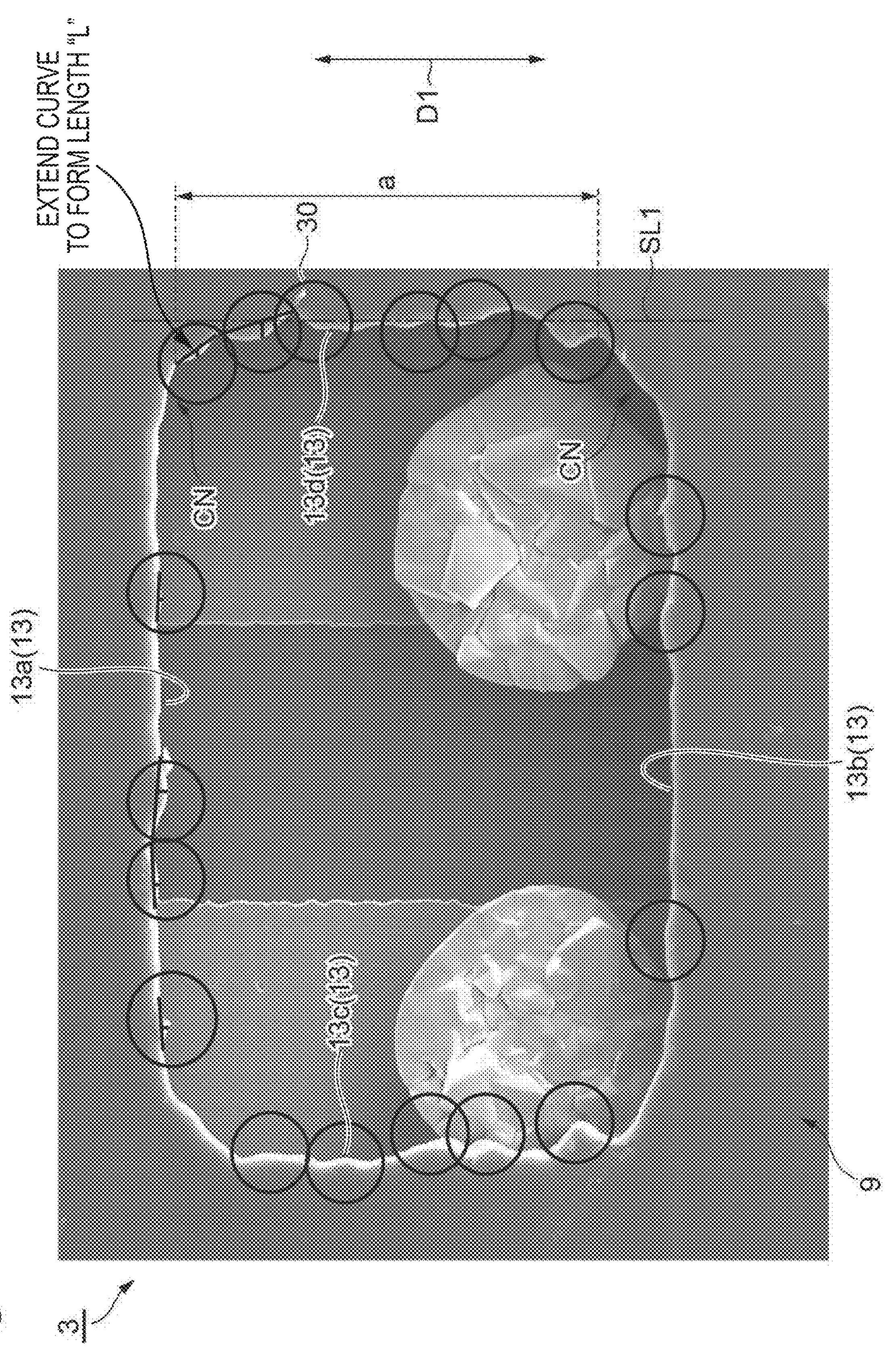
FIG. 6 is an image of the circuit substrate in plan view.

Next, with reference to FIG. 4B, the definition of one uneven portion 30 will be described. As shown in FIG. 4B, a tangent line TL in contact with the valley portions 31 and 31 on both sides of a vertex P1 of the peak portion 32 is set. Next, a vertical line PL that passes through the vertex P1 of the peak portion 32 and is perpendicular to the reference line SL1 is set. A length of the vertical line PL between an intersection P2 of the vertical line PL and the tangent line TL and the vertex P1 is defined as a height dimension H of the peak portion 32. At this time, one having a height dimension H of 150 nm or more is defined as one uneven portion 30. FIG. 6 shows an image of the circuit substrate 3 in plan view. In FIG. 6, circled portions are an example of portions in which the uneven portion 30 is formed.

Figure 5B:
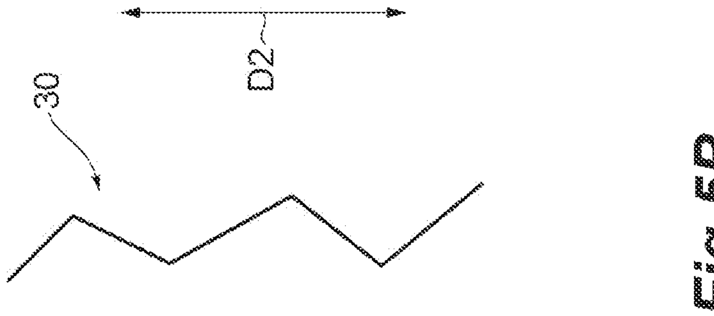
FIGS. 5A and 5B are conceptual diagrams showing the structure of the uneven portion.
Figure 5A:
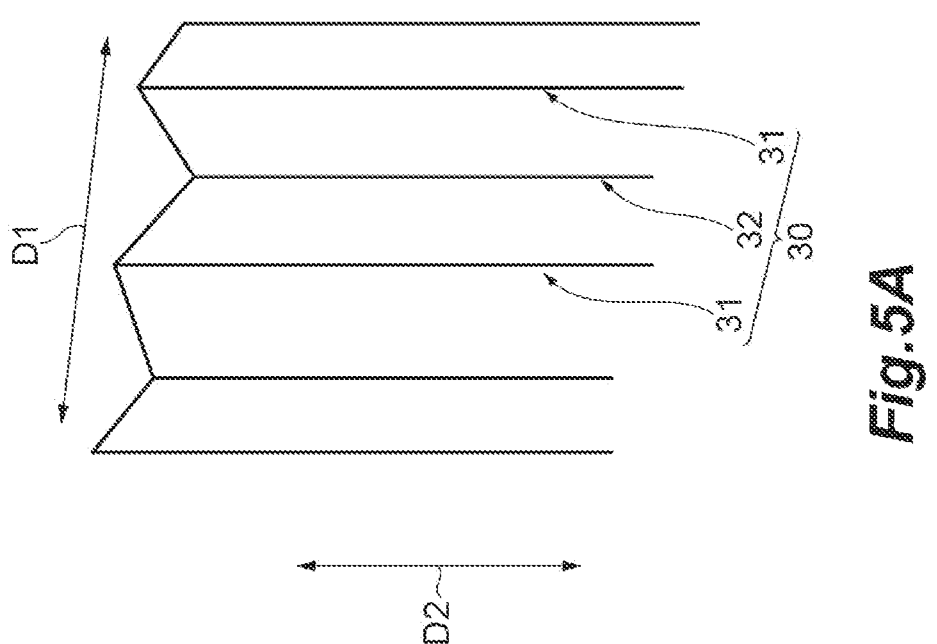

As shown in FIG. 5A, the uneven portion 30 extends in the thickness direction D2 of the circuit substrate 3. That is, groove portions that extend in the thickness direction D2 are formed by the valley portions 31 and the peak portions 32 that form the uneven portion 30. However, as shown in FIG. 5B, a plurality of uneven portions 30 may be arranged in the thickness direction D2.

As shown in FIG. 6, the reference line SL1 is set with respect to the inner side surface 13*d*, and a length of the reference line SL1 is defined as a "length a." Here, a corner R is formed at a corner portion CN between the inner side surface 13*d* and the inner side surface 13*a*, and a corner R is formed at a corner portion CN between the inner side surface 13*d* and the inner side surface 13*b*. The length a excludes a length of portions corresponding to the corners R of the corner portions CN. Next, a wall length corresponding to the reference line SL1 is calculated as a length L. Specifically, a length of a curve drawn by the inner side surface 13*d* within a range defining the length a corresponds to the "length L." For example, when the curve drawn by the inner side surface 13*d* extends in the expansion direction D1 and forms a straight line, a length of the straight line in the expansion direction D1 corresponds to the "length L." Since the plurality of uneven portions 30 are formed on the inner side surface 13*d*, (length L/length a) may be 1.02 or more and more preferably 1.05 or more. Also, (length L/length a) may be 1.20 or less and more preferably 1.15 or less. Further, in plan view, the reference line SL1 is set in the expansion direction D1 in which the inner side surface 13*d* of the wall 9 expands. In this case, the wall 9 has 40 or more, more preferably 160 or more uneven portions 30 per 1 mm of the reference line SL1. Further, the wall 9 has 1200 or less, more preferably 900 or less uneven portions 30 per 1 mm of the reference line SL1. The numerical values are valid not only for the inner side surface 13*d*, but also for the inner side surfaces 13*a*, 13*b*, and 13*c*.

Figure 7C:
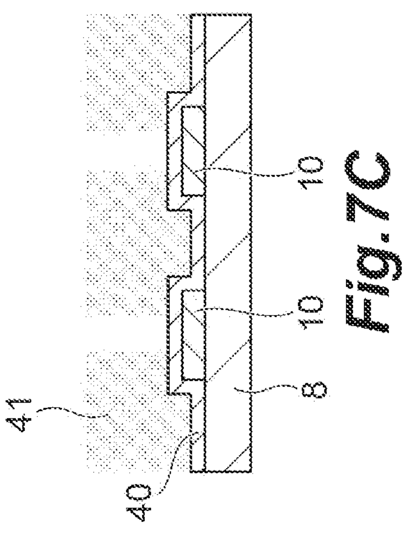
FIGS. 7A, 7B, 7C, 7D, and 7E are schematic cross-sectional views showing a method of manufacturing a circuit substrate and a mounted substrate.
Figure 7B:
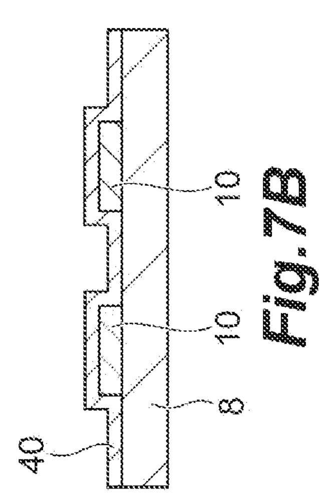
Figure 7A:
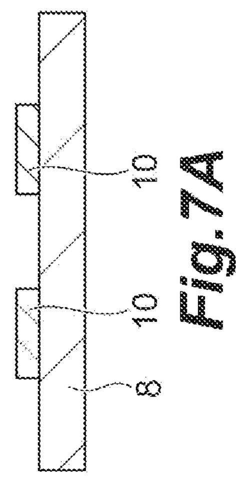
Figure 7E:
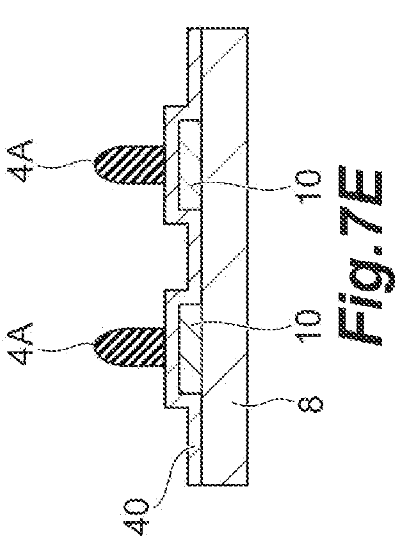
Figure 7D:
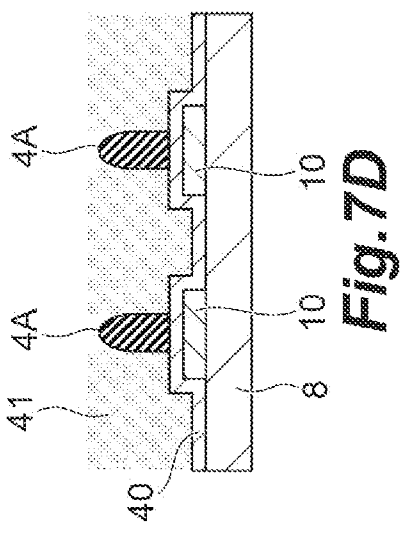

Next, a method for manufacturing the circuit substrate 3 will be described with reference to FIGS. 7A, 7B, 7C, 7D, 7E to 12A, 12B. First, the terminals 10 are formed on the upper surface of the base material 8 (FIG. 7A). Next, a seed film 40 is formed on the upper surfaces of the base material 8 and terminals 10 (FIG. 7B). Next, a resist 41 in which a portion forming the bonding material 4A is opened is formed on an upper surface of the seed film 40 (FIG. 7C). Next, the bonding material 4A is formed by performing electroplating on a portion of the seed film 40 in which the resist 41 is opened (FIG. 7D). Next, the resist 41 is removed from the seed film 40 (FIG. 7E).

Figure 8B:
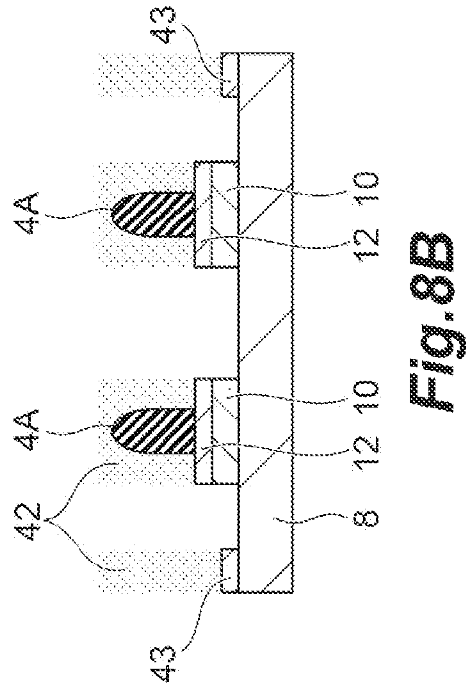
FIGS. 8A, 8B, 8C, and 8D are schematic cross-sectional views showing the method of manufacturing a circuit substrate and a mounted substrate.
Figure 8D:
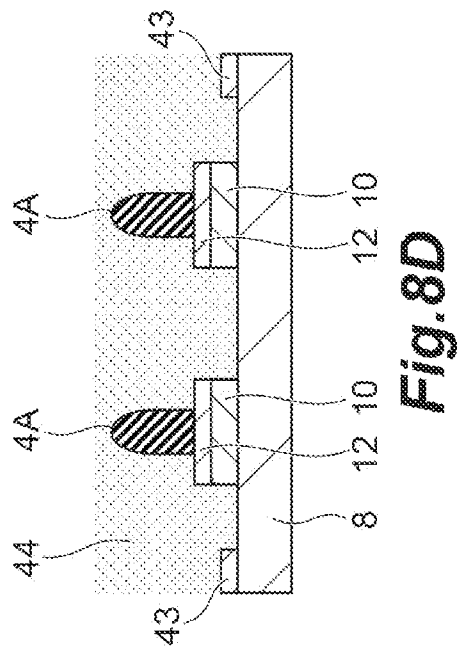
Figure 8A:
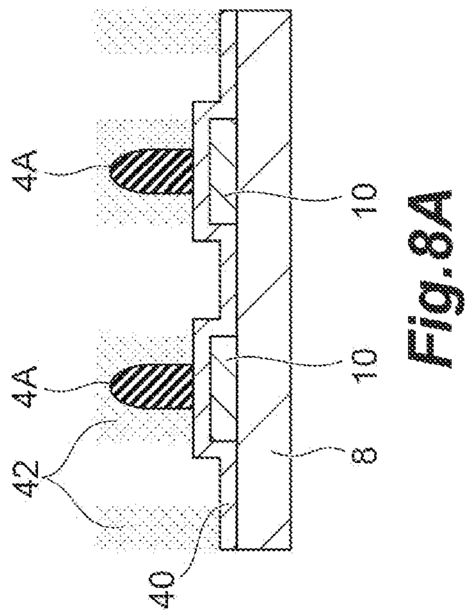
Figure 8C:
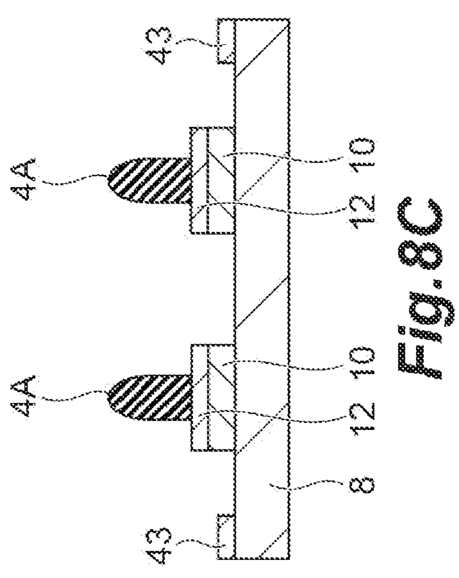

Next, a resist 42 in which a portion to be etched is opened is formed on the upper surface of the seed film 40 (FIG. 8A). Next, etching is performed to remove a part of the seed film 40 (FIG. 8B). Thus, the seed film on the terminal 10 remains as the conductive film 12, and the seed film on an end portion of the base material remains as a reflector 43. Next, the resist 42 is removed from the conductive film 12 and the reflector 43 (FIG. 8C). Next, a resist 44 for forming the wall 9 is applied onto the base material 8 (FIG. 8D).

Next, a mask 46 is placed above the resist 44, and exposure processing is performed (FIG. 9A). At this time, a portion of the resist 44 corresponding to the wall 9 is exposed to light LE, and the portion is cured. The seed film remaining at the end portion of the base material in this exposure process acts as the reflector 43 for the light LE, the light LE is reflected by the reflector 43, and the reflected light LE travels toward the inner periphery. At this time, the reflected light LE is irradiated on a boundary surface 44*a* between a cured portion and a non-cured portion of the resist 44. As a result, an uneven pattern is formed on the boundary surface 44*a* in a mode corresponding to the uneven portion 30 of the wall 9 after thermal curing. Here, a seed film is used as a reflector for reflecting the light LE, but the reflector is not limited to the seed film as long as it reflects light, and another metal film, a film coated with fine metal particles, or glass may be used.

Figures 11A, 11B, 11C:
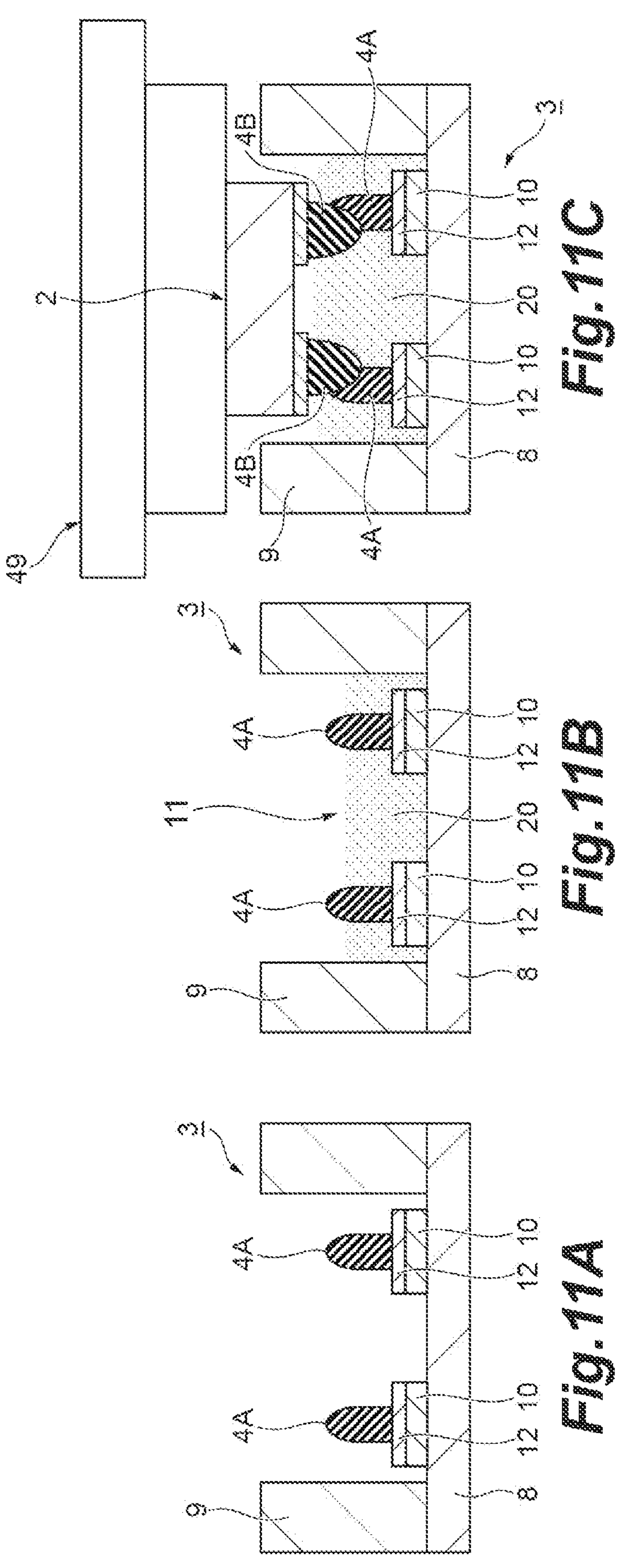
FIGS. 11A, 11B, and 11C are schematic cross-sectional views showing the method of manufacturing a circuit substrate and a mounted substrate.

Next, the base material 8 is heated from below with a hot plate 47 (FIG. 9B). Next, the uncured portion of the resist 44 is removed by developing (FIG. 9C). Next, the entire circuit substrate 3 is placed in a furnace 48 and is heated (FIG. 9D). Thus, the resist 44 is thermally cured to form the wall 9 (FIG. 11A). At this time, the inside of the wall 9 is in a state in which the reflector 43 remains on the upper surface of the base material 8 on which the wall 9 is provided.

Figure 10B:
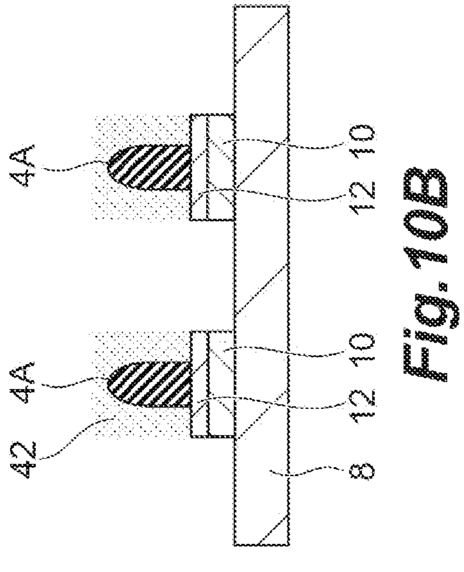
FIGS. 10A, 10B, 10C, and 10D are schematic cross-sectional views showing the method of manufacturing a circuit substrate and a mounted substrate.
Figure 10D:
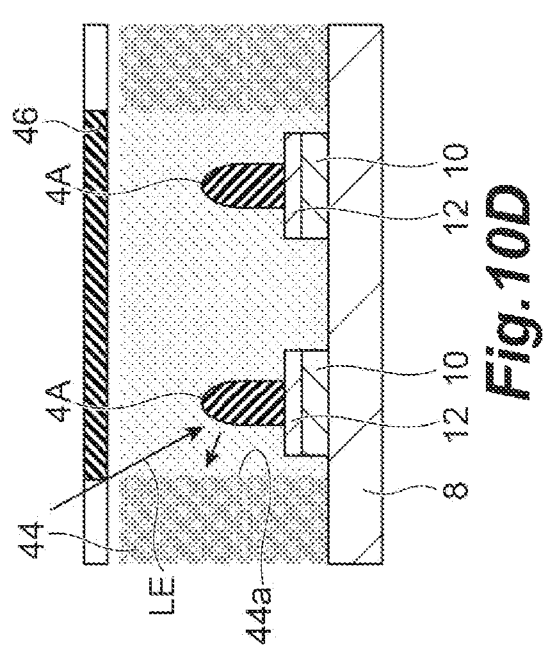
Figure 10A:
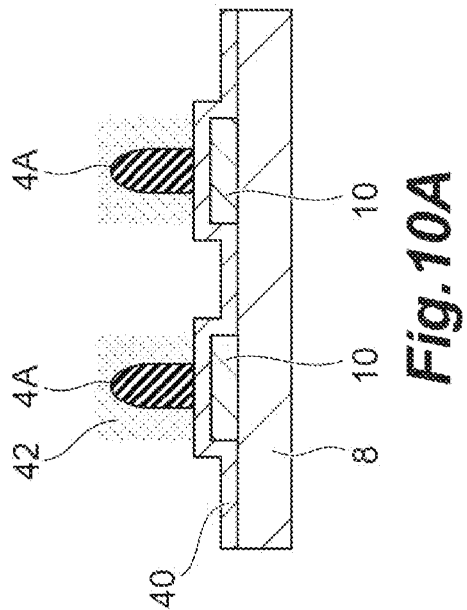
Figure 10C:
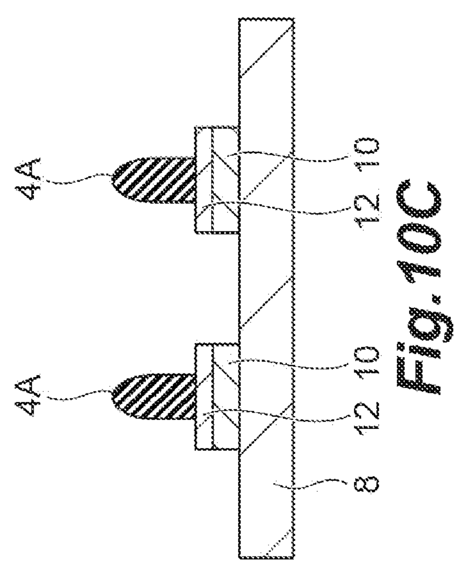

The method of forming the uneven portion 30 is not limited to the method described above, and a method shown in FIGS. 10A, 10B, 10C, and 10D may be employed. First, a resist 42 for removing the seed film 40 is formed only at positions of the terminals 10 (FIG. 10A). As a result, only the conductive film 12 remains after the seed film 40 is removed (FIGS. 10B and 10C). When exposure processing is performed through the mask 46 in this state, some of the light LE that has entered the non-cured portion is reflected by the bonding material 4A and is irradiated to the boundary surface 44*a*. Thus, the pattern of the uneven portion 30 is formed on the boundary surface 44*a*.

When the circuit substrate 3 is completed, the recess 11 is filled with the constituent material 20 (FIG. 11B). Then, the electronic component 2 is held by a holding member 49, and the bonding material 4A and the bonding material 4B are brought into contact with each other inside the constituent material 20 (FIG. 11C). Next, the electronic component 2 is removed from the holding member 49 (FIG. 12A).

Actions and effects of the circuit substrate 3 according to the present embodiment will be described.

In the circuit substrate 3 according to the present embodiment, the wall 9 has the uneven portion 30 on the inner side surface 13. In this case, a surface area of the inner side surface 13 of the wall 9 is increased. With such a configuration, when the constituent material 20 such as an adhesive is disposed inside the wall 9, the constituent material 20 is held by the inner side surface 13 having a large surface area and easily stays inside the wall 9. Therefore, when the electronic component 2 is inserted inside the wall 9, the electronic component 2 is held by the constituent material 20 that easily stays inside the wall 9, and thus bringing-back is curbed (refer to FIG. 12A). As described above, it is possible to improve the yield when the mounted substrate is constructed.

Figure 12B:
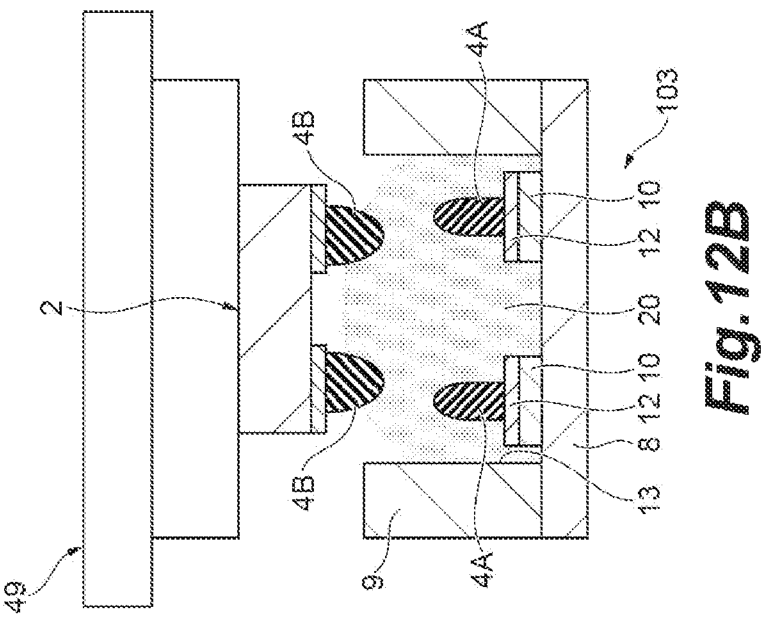
FIGS. 12A, and 12B are schematic cross-sectional views showing the method of manufacturing a circuit substrate and a mounted substrate.
Figure 12A:
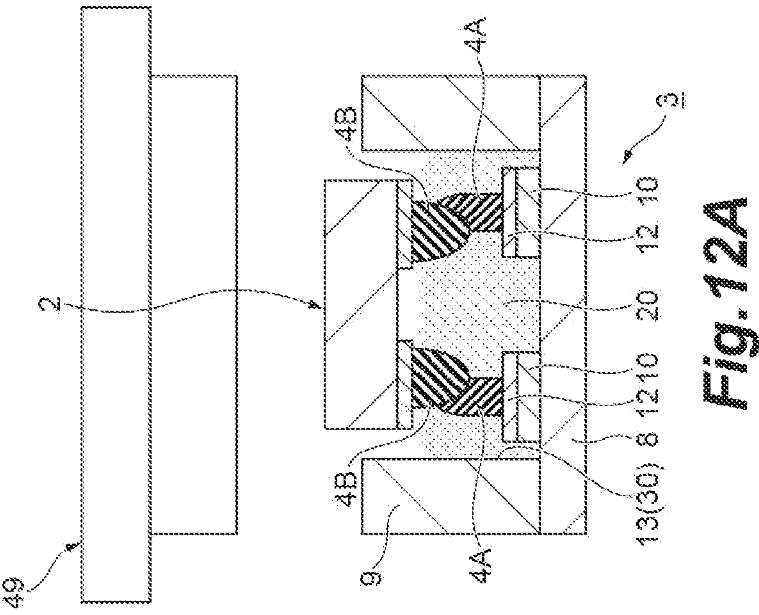

For example, FIG. 12B shows a circuit substrate 103 according to a comparative example in which the uneven portion 30 is not formed on the inner side surface 13. As shown in FIG. 12B, when the holding member 49 is lifted after the electronic component 2 is inserted, it is difficult for the constituent material 20 to be supported by the inner side surface 13 of the wall 9 and thus to stay inside, which causes a problem that the electronic component 2 is brought back. On the other hand, as shown in FIG. 12A, in the circuit substrate 3 according to the present embodiment, the constituent material 20 supported by the uneven portion 30 sufficiently holds the electronic component 2, thereby curbing the problem that the electronic component 2 is brought back.

The uneven portion 30 may extend in the thickness direction D2 of the circuit substrate 3. In this case, when the constituent material 20 is disposed inside the wall 9, entrainment of air between the inner side surface 13 of the wall 9 and the constituent material 20 can be curbed. Therefore, it is possible to curb a reduction of a contact area between the inner side surface 13 and the constituent material 20 due to the entrained air. As a result, a decrease in a holding force of the electronic component 2 by the constituent material 20 can be curbed.

In plan view, when the reference line SL1 is set in the expansion direction D1 in which the inner side surface 13 expands, and the length of the reference line is set to the length a, and the wall length corresponding to the reference line SL1 is set to the length L, (Length L/length a) may be 1.02 or more and 1.20 or less. When (length L/length a) is 1.02 or more, the surface area of the inner side surface 13 of the wall 9 is sufficiently large, and the constituent material 20 can easily stay inside the wall 9. Further, when (length L/length a) is 1.20 or less, it being difficult for the constituent material 20 to enter a valley portion 31 of the uneven portion 30 can be curbed.

In plan view, when the reference line SL1 is set in the expansion direction D1 in which the inner side surface 13 expands, the wall 9 may have 40 or more and 1200 or less uneven portions 30 per 1 mm of the reference line SL1. In this case, when the wall 9 has 40 or more uneven portions 30 per 1 mm of the reference line SL1, the surface area of the inner side surface 13 of the wall 9 is sufficiently large, and the constituent material 20 can easily stay inside the wall 9. In addition, when the wall 9 has 1200 or less uneven portions 30 per 1 mm of the reference line SL1, it being difficult for the constituent material 20 to enter a valley portion 31 of the uneven portion 30 can be curbed.

Inside the wall 9, the reflector 43 may be formed on the upper surface of the base material 8 on which the wall 9 is provided. In this case, light can be reflected by the reflector 43 when the wall 9 is photo-cured. The reflected light can form the pattern of the uneven portions 30 at portions corresponding to the inner side surface 13 of the wall 9.

A mounted substrate 1 according to the present disclosure has the electronic component 2 mounted on the terminal 10 of the circuit substrate 3 described above. According to such a mounted substrate 1, the yield can be improved by mounting the electronic component 2 on the circuit substrate 3 described above.

The present disclosure is not limited to the embodiment described above. For example, the number and arrangement of terminals on the circuit substrate are not particularly limited. Further, although one electronic component 2 is disposed inside the wall 9 in the above-described embodiment, a plurality of electronic components 2 may be disposed. An arrangement mode of the plurality of electronic components 2 is not particularly limited.

Embodiment 1. A circuit substrate having at least one pair of terminals, wherein a bonding material containing a metal element is disposed above the terminals, the pair of terminals and the bonding material are disposed inside a wall formed by an insulator, and the wall has an uneven portion on an inner side surface.

Embodiment 2. The circuit substrate according to embodiment 1, wherein the uneven portion extends in a thickness direction of the circuit substrate.

Embodiment 3. The circuit substrate according to embodiment 1 or 2, wherein, in plan view, when a reference line is set in a direction in which the inner side surface expands, and a length of the reference line is set to a length a, and a length of the wall corresponding to the reference line is set to a length L, (length L/length a) is 1.02 or more and 1.20 or less.

Embodiment 4. The circuit substrate according to any one of embodiments 1 to 3, wherein, in plan view, when the reference line is set in the direction in which the inner side surface expands, the wall has 40 or more and 1200 or less uneven portions per 1 mm of the reference line.

Embodiment 5. The circuit substrate according to any one of embodiments 1 to 4, wherein a reflector is formed on an upper surface of a base material on which the wall is provided inside the wall.

Embodiment 6. A mounted substrate, wherein an electronic component is mounted on the terminals of the circuit substrate according to any one of embodiments 1 to 5.

REFERENCE SIGNS LIST

1 Mounted substrate
3 Circuit substrate
4A Bonding material
8 Base material
9 Wall
10 Terminal
20 Constituent material
30 Uneven portion
43 Reflector

What is claimed is:

1. A circuit substrate having at least one pair of terminals, wherein a bonding material containing a metal element is disposed above the terminals, the pair of terminals and the bonding material are disposed inside a wall formed by an insulator, and the wall has a plurality of uneven portions on each of a plurality of inner side surfaces of the wall that define a recess, wherein a constituent material is disposed in the recess and along the inner side surfaces of the wall, and the constituent material is disposed between the bonding material and the wall such that the bonding material is surrounded by the constituent material on all sides of the bonding material.

2. The circuit substrate according to claim 1, wherein the plurality of uneven portions extends in a thickness direction of the circuit substrate.

3. The circuit substrate according to claim 1, wherein, in plan view, when a reference line is set in a direction in which a first inner side surface of the plurality of inner side surfaces expands, and a length of the reference line is set to a length a, and a length of the wall corresponding to the reference line is set to a length L, a ratio of the length L to the length a is greater than or equal to 1.02 and less than or equal to 1.20.

4. The circuit substrate according to claim 1, wherein, in plan view, when a reference line is set in a direction in which a first inner side surface of the plurality of inner side surfaces expands, the wall has 40 or more and 1200 or less uneven portions per 1 mm of the reference line.

5. The circuit substrate according to claim 1, wherein a reflector is formed on an upper surface of a base material on which the wall is provided inside the wall.

6. The circuit substrate according to claim 1, wherein the plurality of inner side surfaces includes a first inner side surface, a second inner side surface, a third inner side surface and a fourth inner side surface, and the constituent material contacts the first, second, third and fourth inner side surfaces of the wall.

7. A mounted substrate, wherein an electronic component is mounted on the terminals of the circuit substrate according to claim 1.

* * * * *